United States Patent [19]
Gilleo et al.

[11] Patent Number: 6,020,220
[45] Date of Patent: Feb. 1, 2000

[54] COMPLIANT SEMICONDUCTOR CHIP ASSEMBLIES AND METHODS OF MAKING SAME

[75] Inventors: Kenneth B. Gilleo, Erwinna, Pa.; Gary W. Grube; Gaetan Mathieu, both of Pleasanton, Calif.

[73] Assignee: Tessera, Inc., San Jose, Calif.

[21] Appl. No.: 08/709,470

[22] Filed: Sep. 5, 1996

Related U.S. Application Data

[60] Provisional application No. 60/021,412, Jul. 9, 1996.

[51] Int. Cl.[7] ................................................. H01L 21/44
[52] U.S. Cl. ........................................... 438/119; 438/118
[58] Field of Search ................................... 438/107, 108, 438/118, 119

[56] References Cited

U.S. PATENT DOCUMENTS

| | | |
|---|---|---|
| 5,074,947 | 12/1991 | Estes et al. . |
| 5,086,558 | 2/1992 | Grube et al. . |
| 5,148,265 | 9/1992 | Khandros et al. . |
| 5,148,266 | 9/1992 | Khandros et al. . |
| 5,183,711 | 2/1993 | Wada et al. . |
| 5,196,371 | 3/1993 | Kulesza et al. . |
| 5,237,130 | 8/1993 | Kulesza et al. . |
| 5,258,330 | 11/1993 | Khandros et al. . |
| 5,346,861 | 9/1994 | Khandros et al. . |
| 5,347,159 | 9/1994 | Khandros et al. . |
| 5,414,298 | 5/1995 | Grube et al. . |
| 5,455,390 | 10/1995 | DiStefano et al. . |
| 5,476,211 | 12/1995 | Khandros . |
| 5,495,667 | 3/1996 | Farnworth et al. . |
| 5,518,964 | 5/1996 | DiStefano et al. . |
| 5,578,527 | 11/1996 | Chang et al. ............................ 438/119 |
| 5,627,405 | 5/1997 | Chillara . |
| 5,651,179 | 7/1997 | Bessho et al. . |
| 5,677,576 | 10/1997 | Akagawa . |
| 5,749,997 | 5/1998 | Tang et al. .............................. 438/119 |
| 5,834,339 | 11/1998 | Distenfano et al. ..................... 438/118 |
| 5,858,806 | 1/1999 | Nishida ................................... 438/119 |

*Primary Examiner*—Kevin M. Picardat
*Attorney, Agent, or Firm*—Lerner, David, Littenberg, Krumholz & Mentlik, LLP

[57] ABSTRACT

A semiconductor chip package assembly is mounted to contact pads on a die. A compliant interposer layer is disposed between the die and a dielectric substrate wiring layer. The contacts on the die are connected to terminals on the compliant interposer layer by means of a compliant, conductive polymer extending through apertures in the interposer layer. Compliancy in the interposer layer and in the conductive polymer permits relative movement of the terminals on the dielectric substrate wiring layer to the contacts on the die and hence relieves the shear forces caused by differential thermal expansion. The arrangement provides a compact packaged structure similar to that achieved through flip-chip bonding, but with markedly increased resistance to thermal cycling damage. Further, the packaged structure allows the standardization of the packages such that several companies can make competing chips that are packaged such that the resultant packaged structures are roughly the same as far as the end user is concerned.

17 Claims, 3 Drawing Sheets

COMPLIANT SEMICONDUCTOR CHIP ASSEMBLIES AND METHODS OF MAKING SAME

CROSS REFERENCE TO RELATED APPLICATIONS

The present application claims benefit of U.S. Provisional Application No. 60/021,412 filed Jul. 9, 1996.

FIELD OF THE INVENTION

The present invention relates to the art of electronic packaging, and more specifically to assemblies incorporating semiconductor chips and to methods of making such assemblies.

BACKGROUND OF INVENTION

Complex microelectronic devices such as modem semiconductor chips require numerous connections to other electronic components. For example, a complex microprocessor die may require hundreds or thousands of connections to external devices.

The size of the resulting chip structure is a major concern. Many times the size of each such structure influences the size of the overall electronic product. Moreover, the size of each assembly to some extent controls the internal impedance of the microelectronic device and also the required distance between each chip and other chips, or between each chip or other elements of the circuit. Delays in transmission of electrical signals between chips are directly related to both the internal impedance's and these distances. These delays limit the speed of operation of the device. For example, in a computer where a central processing unit operates cyclically, signals must be interchanged between the central processing unit chip and other chips during each cycle. The transmission delays inherent in such interchanges often limit the clock rate of the central processing chip. Thus, more compact interconnection assemblies, with smaller distances between chips and smaller signal transmission delays can permit faster operation of the central processing chip.

Further, compensation for the substantial stress caused by thermal cycling as temperatures within the device change during operation are of major concern. The electrical power dissipated within the chip heats the chip and its supporting substrate, such as printed wiring boards ("PWB"), so that the temperature of the chip and PWB rises each time the device is turned on and falls each time the device is turned off. As the chip and the PWB ordinarily are formed from different materials having different coefficients of thermal expansion, the chip and PWB expand and contract by different amounts ("CTE mismatch"). This causes the electrical contacts on the chip to move relative to the electrical contact pads on the substrate as the temperature of the chip and PWB changes. This relative movement deforms the electrical interconnections between the chip and PWB and places them under mechanical stress. These stresses are applied repeatedly with repeated operation of the device, and can cause fatigue of the electrical interconnections. Thermal cycling stresses may occur even where the chip and PWB are formed from like materials having similar coefficients of thermal expansion, because the temperature of the chip may increase more rapidly than the temperature of the PWB when power is first applied to the chip.

The cost of the chip and PWB assembly is also a major concern. All these concerns, taken together, present a formidable engineering challenge. There are many different ways used to attach die to PWBs all of which can be broken down into two groups: unpackaged die and packaged die.

An example of unpackaged die includes direct chip attachment to the PWB using many different kinds of electrical/mechanical means. One embodiment of a direct chip attach method is commonly referred to as flip chip or C4. In flip-chip bonding, contacts on the front surface of the die are provided with bumps of solder. The PWB has contact pads arranged in an array corresponding to the array of contacts on the die. The die, with the solder bumps, is inverted so that its front surface faces toward the top surface of the PWB, with each contact and solder bump on the chip being positioned on the appropriate contact pad of the PWB. The assembly is then heated so as to liquefy the solder and bond each contact on the die to the confronting contact pad of the PWB. Because the flip-chip arrangement does not require leads arranged in a fan-out pattern, it provides a compact assembly. The area of the substrate occupied by the contact pads is approximately the same size as the die itself. Moreover, the flip-chip bonding approach is not limited to contacts on the periphery of the die. Rather, the contacts on the die may be arranged in a so-called "area array" covering substantially the entire front face of the die. Flip-chip bonding therefore is well suited to use with chips having large numbers of I/O contacts. However, assemblies made by flip-chip bonding are quite susceptible to thermal stresses. The solder interconnections are relatively inflexible, and may be subjected to very high stress upon differential expansion of the chip and substrate. These difficulties are particularly pronounced with relatively large chips. For this reason, flip chip dies are underfilled with a curable liquid epoxy after attachment to a PWB in an attempt to compensate for the CTE mismatch. This underfill process is very expensive. Further, flip chip requires expensive routing layers to be placed on the face of the die. Further still, it is difficult to test and operate or "burn-in" chips having an area array of contacts before attaching the chip to the substrate. Moreover, it is virtually impossible to standardize a flip chip type die. In packaging, it is crucial that standards be reached so that the end user can meet its semiconductor chip needs from multiple companies—this allows for a more price competitive market place for the end user which is insensitive to the production and defect variations of any one chip manufacturer. Other examples of unpackaged, non-standardizable solutions include U.S. Pat. Nos. 5476211 and 5495667.

Examples of packaged die include ball grid array ("BGA") and chip scale packaged ("CSP") semiconductor chips which are connected to external circuitry through the package interface. The external terminals on these packages are generally either disposed in regular grid-like patterns, substantially covering the face surface of the chip (commonly referred to as an "area array") or in elongated rows extending parallel to and adjacent each edge of the chip front surface. BGA and CSP technology generally refers to a large range of semiconductor packages which typically uses an interconnection process such as wirebonding, beam lead, tape automated bonding ("TAB") or the like as an intermediate connection step to interconnect the chip contacts to the exposed package terminals. This results in a standardizable, testable device prior to mechanical attachment to the bond pads on a PWB. The BGA or CSP packaged chips are then typically interconnected with their supporting substrates using standard tin-lead solder connections. In most such packaged devices, the mechanical stress/strain due to thermal cycling (the heating and cooling cycles of the chip during operation) is almost completely placed on the solder connections between the chip and the substrate. However, as described above, solder was never intended to undergo such forces and many time encounters significant elastic solder deformation causing the solder to fatigue brought on by the thermal cycling. As the solderballs get smaller in diameter, thermal cycling has an even more profound fatiguing affect on the solder.

As the features of semiconductor chip packages continue to be reduced in size, as in the case of CSPs, the number of chips packed into a given area will be greater and thus the heat dissipated by the each of these chips will have a greater effect on the thermal mismatch problem. Further, the solder cracking problem is exacerbated when more than one semiconductor chip is mounted in a package, such as in a multichip module. As more chips are packaged together, more heat will be dissipated by each package which, in turn, means the interconnections between a package and its supporting substrate will encounter greater mechanical stress due to thermal cycling. Further, as more chips are integrated into multichip modules, each package requires additional interconnections thereby increasing the overall rigidity of the connection between the module and its supporting substrate.

Several patented inventions developed and assigned to the present assignee deal effectively with this BGA/CSP thermal mismatch problem, but in a specifically different way than the present invention. The patent numbers of some of these commonly owned patents are U.S. Pat. Nos. 5,148,265, 5,148,266, 5,258,330, 5,346,861, 5,347,159, 5,414,298, 5,455,390, and 5,518,964 to name a few.

Despite the positive results of the aforementioned commonly owned inventions, still further improvements would be desirable.

SUMMARY OF THE INVENTION

The present invention addresses these needs.

The present invention includes a semiconductor chip package assembly which is comprised of a semiconductor die having a face surface bearing a plurality of contacts thereon. A dielectric substrate wiring layer is juxtaposed and mechanically attached to the face surface of the die by a compliant interposer layer. The dielectric substrate wiring layer has a first surface with a plurality of conductive bond pads in rough alignment with respective contacts on the die and a second surface having a plurality of conductive terminals, the bond pads being electrically connected to the terminals. The compliant interposer layer is at least partially comprised of a flexible conductive polymer electrically connecting the contacts on the die to respective, aligned bond pads on the first surface of the dielectric substrate. The compliant interposer layer is compliant enough to substantially mechanically decouple the shear forces and other thermal cycling stresses due mainly to the CTE mismatch acting on a resulting chip package during operation.

These and other objects, features and advantages of the present invention will be more readily apparent from the detailed description of the preferred embodiment set forth below taken in conjunction with the accompanying drawings.

DETAILED DESCRIPTION OF THE PREFERRED EMBODIMENTS

Figure 1A:
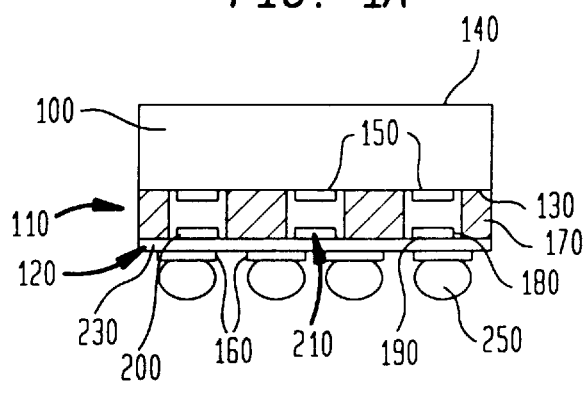
FIG. 1A shows a side view of a compliant semiconductor chip package, according to the present invention.

As shown in FIG. 1A, the present invention is a semiconductor chip package assembly which is comprised of several elements: namely, a semiconductor die 100, an compliant interposer layer 110 and a dielectric substrate wiring layer 120.

The semiconductor chip 100 has a face surface 130 and a back surface 140 which are substantially planar with respect to each other. The face surface further has chip contacts 150 disposed about the face surface so that electrical signals may be transmitted and received from and to the electrical circuit within the die 100. The chip contacts 150 may disposed in a so called area array pattern, typically a substantially uniformity spaced grid pattern, on the face surface 130 or the contacts 150 may be disposed on the periphery of the face surface 130 of the die 100 substantially uniformily spaced from each other.

Figure 1B:
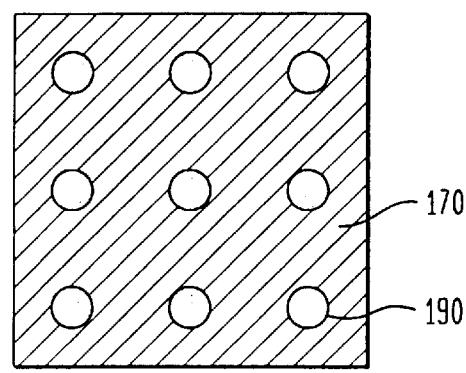
FIG. 1B shows a top plan view of the compliant interposer layer shown in FIG. 1A, according to the present invention.

The compliant interposer layer 110, as shown in cross-section FIG. 1A and in a top plan view in FIG. 1B (with the dielectric substrate wiring layer 120 removed from view), is typically approximately the same size as the face surface 130 of the die 100. The purpose of the compliant interposer layer 110 is three fold. First, it must mechanically interconnect itself to both the face surface 130 of the die 100 and the dielectric substrate wiring layer. Second, it must be compliant enough to substantially mechanically decouple the shear forces due mainly to the CTE mismatch acting on a resulting chip package during operation. Third, it must provide a reliable electrical connection from the contacts 150 to the terminals 160 on the dielectric substrate wiring layer 120. In this embodiment, the compliant interposer layer 110 is comprised of a thermoset or thermoplastic (referred to herein as a low modulus material 170), such as silicones, flexibilized epoxies, gels, fluropolymers or foams and other microcellular materials or even a solid uncured composite of solid epoxy resin, hardener, filler material and sufficient hardener to make a paste that can be applied and dried such that it melts upon the application of heat and subsequently cures to a permanent compliant solid. The low modulus material 170 further has a plurality of apertures 180 therethrough which are aligned with the contacts 150 on the die 100. Flexible, conductive polymer 190 (typically a polymer loaded with conductive/metallic elements) is disposed within each of the apertures 180. Such conductive polymers 190 may include silver filled epoxy (or flexibilized epoxy), silver filled silicone resin, or silver filled polysiloxanepolyimides.

Figure 3A:
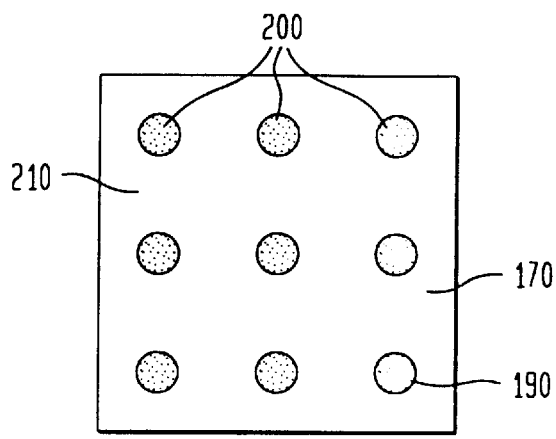
FIGS. 3A and 3B show the first major surface and the second major surface, respectively, of the dielectric substrate wiring layer, according to the present invention.
Figure 3B:
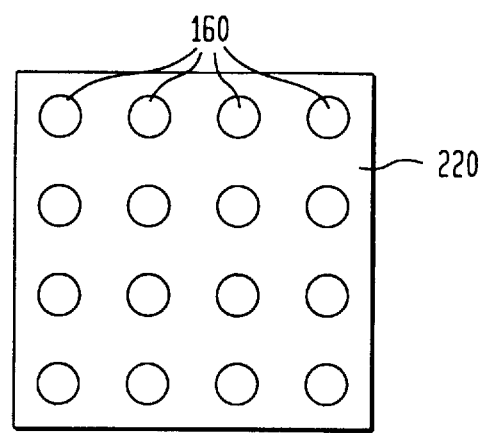
Figure 3C:
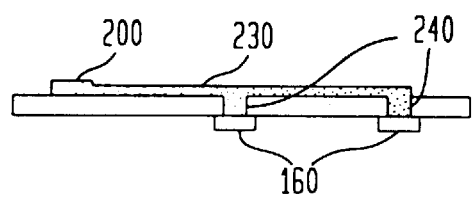
FIGS. 3C and 3D show magnified side views of two separate embodiments of the dielectric substrate wiring layer, according to the present invention.

As shown in the magnified view in FIG. 3A–C, the dielectric substrate wiring layer 120 has a first major surface 210 and a second major surface 220. The dielectric substrate 120 is typically comprised of a flexible, but substantially inextensible, film circuit element (or "flex circuit") 130 preferably formed from a polymeric material, such as Kapton™ or PEN (Polyethylene Naphthalate) or equivalent substrate (which has approximately the same CTE as the leads 230) of an approximate thickness between 25 microns and 75 microns. The first major surface 210 is juxtaposed with and attached to the compliant interposer layer 110 and further has bond pads 200 in alignment with the conductive polymer 190 disposed within the apertures 180 in the compliant interposer layer 110 such that the bond pads make electrical connection with respective columns of conductive polymer 190 such that the bond pads are in electrical connection with the contacts 150 on the die 100. The first major surface 210 further has flexible, conductive leads 230 attached thereto and electrically connected to the bond pads 200. The leads are electrically connected to one or more conductive vias 240 extending through the dielectric substrate 120 to the conductive terminals 160 on the second major surface 220. Preferably, the terminals 160 are positioned in a peripheral array or grid array which is standard in the industry for the type of die being packaged. For example, a DRAM packaged die sold by one company may be interchangeable with a DRAM packaged die sold by a second company. The physical differences in the dies may be made transparent to the end user, such as a computer manufacturer.

Figure 3D:
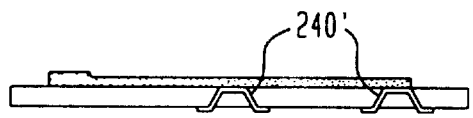

It should be noted that the conductive leads 230 could be located on the second major surface 220; however, preferably they are located on the first major surface 210 so that the second major surface 220 is free to meet any standard terminal 160 pitch, as discussed above. Further, the leads 230 may be located on both surfaces (210/220) to increase the possible wiring density. FIG. 3D shows an alternate dielectric substrate having so called blind-vias 240' in place of the vias 240. The dielectric substrate may also include a multi-layer substrate having one or more power or ground layers to better control the package's impedance and subsequent electrical performance.

Preferably, the package is made on the dielectric substrate 120 and then both mechanically attached and electrically connected to the die using heat and pressure. In this way, a "known good" package can be attached to a die 100 thereby substantially reducing the chances of wasting operational dies 100 by attaching inoperational packages thereto. There are many different ways of assembling the package. The low modulus material 170 may be a fully cured bond ply sheet (dielectric film coated on both sides with dry film adhesive) so that it may be attached to the die 100 and the dielectric substrate wiring layer 120. On the other hand, the low modulus material 170 may be screen or stenciled onto the dielectric substrate 120, cured and attached to the die 100 using an adhesive layer. The low modulus material 170 may also be screened onto the dielectric substrate 120 and only semi-cured ("B-staged") or may be a solid uncured epoxy type resin having a hardener which is applied as a solvent base paste. The die 100 may then be attached to the B-staged compliant interposer layer 110 using heat and pressure thereby mechanically attaching the low modulus material 170 and the conductive polymer 190 to the die/contacts. Preferably, the low modulus layer 170 shrinks slightly as it mechanically attaches to the die 100 in response to the heat and pressure of attachment thereby expelling gas bubbles/voids and providing a substantially uniform bond therebetween.

Figure 2A:
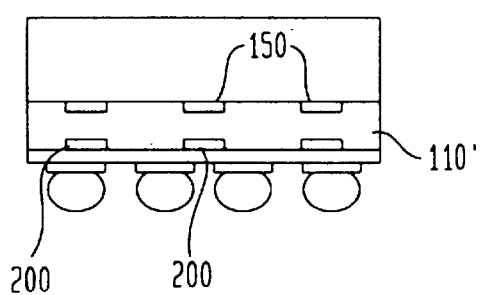
FIG. 2A shows a side view of an alternate compliant semiconductor package, according to the present invention.
Figure 2B:
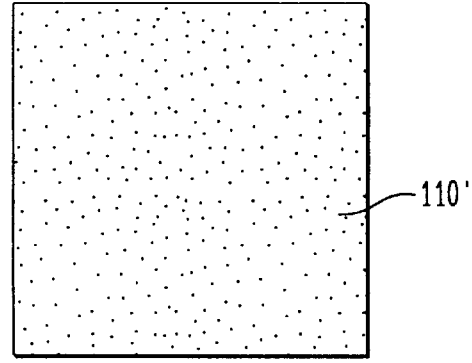
FIG. 2B shows a top plan view of the compliant interposer layer shown in FIG. 2A.

FIGS. 2A and 2B show another embodiment in which the compliant interposer layer 110' is entirely comprised of a compliant anisotropic conductive layer. With such a layer 110' the electrical signals are only transmitted in the axial direction from the contacts 150 to the bond pads 200. It is therefore important that the contacts 150 and the bond pads 200 are roughly aligned with one another. One example of a commercial embodiment of an anisotropic conductor layer is marketed under the "Z-Link" and manufactured by Sheldahl. The compliant anisotropic conductive layer may be specifically biased through heat and pressure such that it conducts better between respective contact and bond pad pairs. The compliant anisotropic conductive layer may further be biased in the area between two adjacent contacts such that an electrical connection is made therebetween.

FIGS. 4–7 show various methods of providing optional contact interfaces on the die contacts 150. The contact interfaces are used to ensure that the aluminum die contacts do not get an eventual build up of aluminum oxide, which detrimentally effects the conductivity of the contact 150.

Figure 4A:
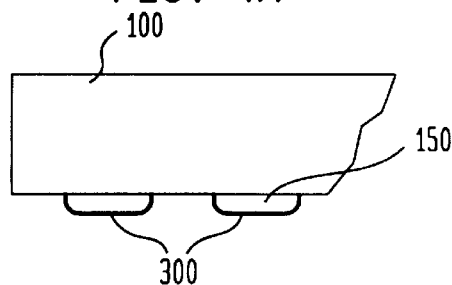
FIG. 4A shows a magnified side view and FIG. 4B a side view of an alternate package embodiment, with regard to the embodiment shown in FIG. 1A, having a electroplated type contact interface, according to the present invention.
Figure 4B:
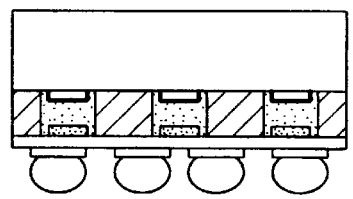

FIG. 4A shows a magnified side view and FIG. 4B a side view of an alternate package embodiment with regard to the embodiment shown in FIG. 1A. In these figures, a contact interface 300 is disposed or applied over the contacts 150 by electroplating the aluminum contacts 150 with a compatible conductive metal which does not oxide, such as gold. Alternately, a gold bump transfer process similar to that used in bonding cantilevered TAB leads may be used. Here, gold bumps would be plated onto a temporary carrier in an array which corresponds to the contact 150 locations. The gold bumps are then aligned and attached to the contacts 150 using heat and pressure. The temporary carrier can then be removed. Further still, the contacts 150 may be covered with a conductive adhesive which does not form oxides.

Figure 5A:
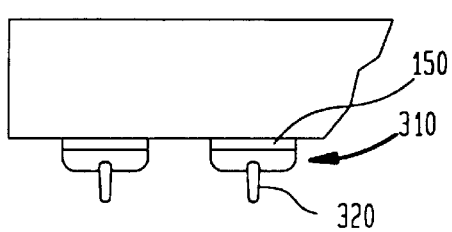
FIG. 5A shows a magnified side view and FIG. 5B a side view of an alternate package embodiment, with regard to the embodiment shown in FIGS. 4A and 4B, having a ball bond type contact interface, according to the present invention.
Figure 5B:
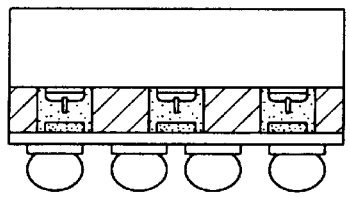

FIG. 5A shows a magnified side view and FIG. 5B a side view of an alternate package embodiment with regard to the embodiment shown in FIG. 1A. In this embodiment, a gold ball bumping process is employed to ball bond a gold wire 310 to each contact 150 using a standard wire bonding machine. After the wire is bonded to a contact 150, the wire 310 is then pulled away from the contact 150 to form a ball shape at the contact 150 having a tail portion 320. Gold wire bonds are well known to be reliable. The resulting gold surface of the bonded wire/tail combination provide a very good connection surface and geometry for mechanical attachment and electrical connection to the conductive polymer 190.

Figure 6A:
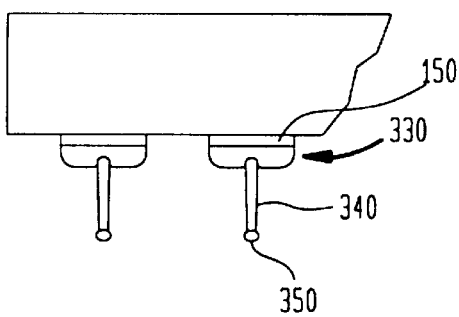
FIG. 6A shows a magnified side view and FIG. 6B a side view of an alternate package embodiment, with regard to the embodiment shown in FIGS. 4A and 4B, having a ball bond type contact interface further having a tail of predetermined length, according to the present invention.
Figure 6B:
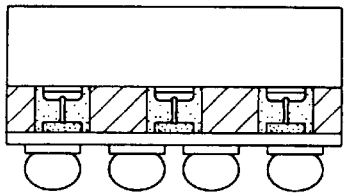

FIG. 6A shows a magnified side view and FIG. 6B a side view of an alternate package embodiment with regard to the embodiment shown in FIG. 5. FIG. 6A extends the idea of a the ball bonding process in FIG. 5 such that after the gold wire 330 is ball bonded to the contact 150 the wire bonding machine creates a tail portion 340 the length of which is carefully controlled instead of merely pulling the wire away after bonding. Here, the wire is typically detached using a common "flame off" technique creating a rounded feature 350 at the distal end of the wire 330. The wire 330 may then be disposed within the conductive polymer 190 to again increase the connection surface and geometry for mechanical attachment and electrical connection to the conductive polymer 190. Further, the wire 330 may be made long enough that it is actually touching, or preferably biased against, the bond pad 200 on the dielectric substrate 120 thereby increasing the conductivity of the electrical connection. In an alternate embodiment, the package can be built on the die 100, as opposed to being built on the dielectric substrate 120. Here, this would mean the compliant interposer layer 110 would be attached to the die 100 such that the conductive polymer is disposed in the apertures and substantially covers the bonded wire 330 features and the substrate 120 would subsequently be attached thereto.

It should be noted that the embodiment shown in FIG. 6 may have a conductive adhesive surrounding the ball bonded wires (330/360) (or at least the distal end of the wires) to help support the wires when they are disposed within the conductive polymer 190. Such conductive adhesive may be comprised of the same material as the conductive polymer 190 and acts to increase the spring constant of the bonded wires.

Figure 7:
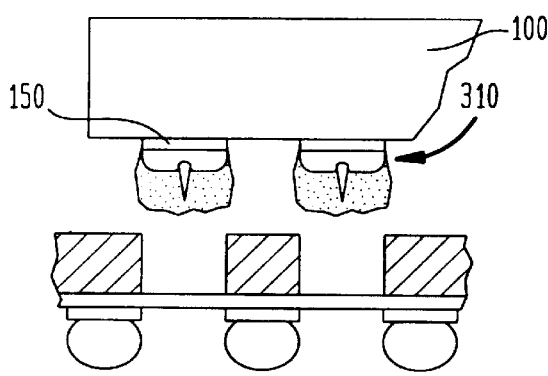
FIG. 7 shows a magnified side view of an alternate package embodiment, with regard to the embodiment shown in FIGS. 4A and 4B, having a ball bond type contact interface further having a tail of predetermined length and shape, according to the present invention.

FIG. 7 shows a similar embodiment as that shown in FIG. 5 except that a conductive paste or B-staged conductive polymer is first provided on the wire bonded wire 310 and the wire/paste is then inserted into the apertures in the compliant layer. A heat-cure operation then mechanically bonds the die to the package and electrically connects the contacts on the die to respective terminals on the dielectric substrate wiring layer.

Having fully described several embodiments of the present invention, it will be apparent to those of ordinary skill in the art that numerous alternatives and equivalents exist which do not depart from the invention set forth above. It is therefore to be understood that the present invention is not to be limited by the foregoing description, but only by the appended claims.

What is claimed is:

1. A method of making a semiconductor chip package assembly, comprising the steps of:

providing a dielectric substrate wiring layer, the dielectric substrate with a first surface having a plurality of conductive bond pads and a second surface having a plurality of conductive terminals, the bond pads being electrically connected to the terminals;

providing a semiconductor die having a face surface bearing a plurality of contacts such that the contacts are in rough alignment with respective bond pads on the dielectric substrate; and disposing a compliant interposer layer such that it mechanically couples the first surface of the dielectric substrate to the face surface of the die, wherein the compliant interposer layer is at least partially comprised of a flexible conductive polymer which electrically connects respective aligned contacts and bond pads.

2. The method as claimed in claim 1, wherein the compliant interposer layer is comprised out of a compliant anisotropic conductive layer which conducts solely in an axial direction from the contacts to their respective bond pads.

3. The method as claimed in claim 2, further comprising the step of biasing the compliant anisotropic conductive layer in the areas of desired conductance between respective contacts and bond pads.

4. The method as claimed in claim 2, further comprising the step of biasing the compliant anisotropic conductive layer in the areas of desired conductance between adjacent contacts.

5. The method as claimed in claim 4, wherein both of the steps of biasing the compliant anisotropic conductive layer include applying heat and pressure to the compliant anisotropic conductive layer.

6. The method as claimed in claim 1, wherein the compliant interposer layer is comprised of a substantially uniform sheet having a plurality of apertures therethrough, the disposing step further including the step of depositing the compliant conductive polymer within each of the apertures.

7. The method as claimed in claim 6, wherein the disposing step includes the steps of attaching the complaint interposer layer to the substrate and subsequently attaching the face surface of the die to the compliant interposer layer.

8. The method as claimed in claim 7, wherein the disposing step further includes the step of depositing the compliant conductive polymer within the apertures subsequent to the step of attaching the compliant interposer layer to the dielectric substrate but prior to the step of attaching the face surface of the die to the compliant interposer layer.

9. The method as claimed in claim 6, further comprising the step of providing a contact interface on each of the contacts on the die, whereby the contact interface performs the function of ensuring the conductivity of the contact.

10. The method as claimed in claim 9, wherein the step of providing a contact interface is selected from the group consisting of:

(a) electroplating a layer of gold;

(b) transfer bumping a bump or post of gold; and (c) applying a conductive adhesive.

11. A method of making a semiconductor chip package assembly, comprising the steps of:

providing a dielectric substrate wiring layer, the dielectric substrate with a first surface having a plurality of conductive bond pads and a second surface having a plurality of conductive terminals, the bond pads being electrically connected to the terminals;

providing a semiconductor die having a face surface bearing a plurality of contacts such that such contacts are in rough alignment with respective bond pads on the dielectric substrate;

disposing a compliant interposer layer comprised of a substantially uniform sheet having a plurality of apertures therethrough such that it mechanically couples the first surface of the dielectric substrate to the face surface of the die, wherein the compliant interposer layer is at least partially comprised of a flexible conductive polymer which electrically connects respective aligned contacts and bond pads, and wherein the compliant conductive polymer is deposited within each of the apertures;

providing a contact interface on each of the contacts on the die by ball bonding gold wire to each contact, whereby the contact interface performs the function of ensuring the conductivity of the contact.

12. The method as claimed in claim 11, wherein the ball bonding step includes the step of creating a wire tail extending from the ball bond.

13. The method as claimed in claim 12, wherein the wire tail creation step includes the step of ensuring the length of each of the wire tails are approximately the same.

14. The method as claimed in claim 13, wherein the wire tail extends from the ball bond to a distal end, wherein the wire tail creation step further includes the step of providing a ball-like feature on the distal end of the wire tail.

15. The method as claimed in claim 14, wherein the ball bonding step further includes the step of shaping the wire into a compliant structure.

16. The method as claimed in claims 14 or 15, wherein the step of attaching the die to the compliant interposer layer further includes biasing the wire tail against the contacts of the die.

17. The method as claimed in claims 14 or 15, further comprising the step of providing a conductive adhesive on at least a portion of the ball bonded wires to increase the spring constant of the bonded wires.

* * * * *

UNITED STATES PATENT AND TRADEMARK OFFICE
CERTIFICATE OF CORRECTION

| | | |
|---|---|---|
| PATENT NO. | : | 6,020,220 |
| DATED | : | February 1, 2000 |
| INVENTOR(S) | : | Gilleo et al. |

It is certified that error appears in the above-identified patent and that said Letters Patent is hereby corrected as shown below:

Title page, item [75]
In the Inventors section, "Erwinna, Pa." should read --Chepachet, RI--.

Column 3, line 14, "time" should read --times--.
Column 3, line 24, cancel the word --the--.
Column 4, line 34, "a" should read --an--.
Column 4, line 57, "an" should read --a--.
Column 4, line 66, after "may" insert the word --be--.
Column 4, line 67, "so called" should read --so-called--.
Column 6, line 11, "so called" should read --so-called--.
Column 6, line 29, "screen" should read --screened--.
Column 6, line 55, after "the" insert --trademark--.
Column 7, line 26, "provide" should read --provides--.
Column 7, line 33, cancel the word --a--.
Column 10, line 22, "or" should read --and--.
Column 10, line 26, "or" should read --and--.

Signed and Sealed this

Twenty-sixth Day of December, 2000

Attest:

Q. TODD DICKINSON

*Attesting Officer*        *Director of Patents and Trademarks*